May 19, 1964 B. M. WOLFFRAMM ETAL 3,134,048
PULSE CIRCUIT FOR ELECTRONIC FLUSH DEVICE
Filed Oct. 26, 1960 3 Sheets-Sheet 1

INVENTORS,
Bodo M. Wolfframm
Wolfgang G. Pfeiffer
BY Warren T. Jessup
ATTORNEY

PULSE CIRCUIT FOR ELECTRONIC FLUSH DEVICE

Filed Oct. 26, 1960

3 Sheets-Sheet 2

*INVENTORS,*
Bodo M. Wolfframm
Wolfgang G. Pfeiffer
BY
Warren T. Jessup
ATTORNEY May 19, 1964 B. M. WOLFFRAMM ETAL 3,134,048

PULSE CIRCUIT FOR ELECTRONIC FLUSH DEVICE

Filed Oct. 26, 1960 3 Sheets-Sheet 3

*INVENTORS,*
Bodo M. Wolfframm
Wolfgang G. Pfeiffer
*BY*
Warren T. Jessup
ATTORNEY United States Patent Office 3,134,048

Patented May 19, 1964

3,134,048

PULSE CIRCUIT FOR ELECTRONIC FLUSH DEVICE

Bodo M. Wolframm, Whittier, and Wolfgang G. Pfeiffer, Hawthorne, Calif., assignors to Magnetic Research Corporation, Hawthorne, Calif., a corporation of California Filed Oct. 26, 1960, Ser. No. 65,124
12 Claims. (Cl. 315—206)

This invention relates to pulse circuits, and more particularly to pulse circuits for providing high energy pulses energized from a low voltage source, such as a low voltage D.C. battery, and is particularly applicable for the pulsing of an electronic flash device.

Most electronic flash devices, when energized from low voltage sources such as low voltage batteries, find it necessary to employ either mechanical vibrators or static D.C. to A.C. converters in order to permit of step up transformers, to raise the voltage to the necessary level. Such converter devices are susceptible to failure, particularly under environment extremes of heat, shock, vibration, humidity, etc. It is an object of this invention to provide a source of pulses, particularly for an electronic flash device, which does not employ electronic or gas tubes. transistor converters, or mechanical vibrators, and thereby obviates the problems implicit in such converter devices.

It is a further object of this invention to provide pulse circuits which produce uniform, repeatable output pulses of high energy and short duration.

It is a further object of this invention to provide a circuit which may be powered from either a D.C. or an A.C. source.

It is another object of this invention to provide a pulse circuit in which the pulses may be easily frequency modulated.

It is another object of this invention to provide a pulse circuit whose pulse repetition frequency may be determined primarily by an external source, such as a trigger generator, whereby the circuit may be synchronized with other signals or frequency modulated while operating.

It is a further object of this invention to provide a pulse circuit whose repetition rate may be changed arbitrarily without loss of efficiency and without changing the components.

It is another object of this invention to provide a pulse circuit which may be time or frequency modulated without change in amplitude or change in output power of the pulse, provided the modulation frequency is above the charging rate of the storage element used in the circuit.

In accordance with these and other objects which will become apparent hereinafter, preferred forms of the present invention will now be described with reference to the accompanying drawings wherein.

Figure 1:
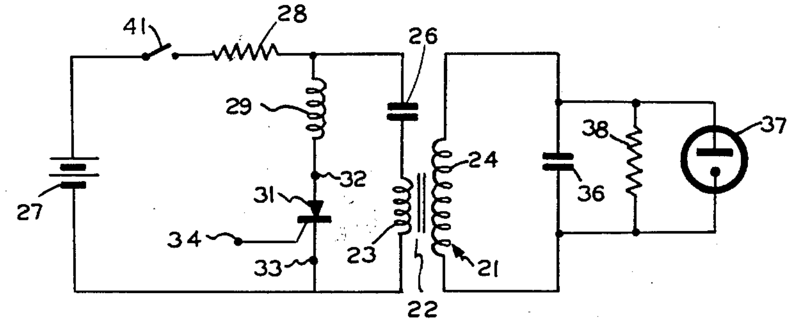
FIG. 1 is a circuit diagram of a fundamental form of the present invention.
Figure 9:
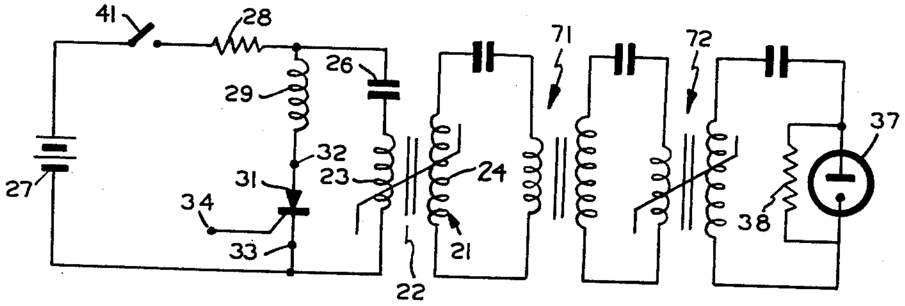
Figure 8:
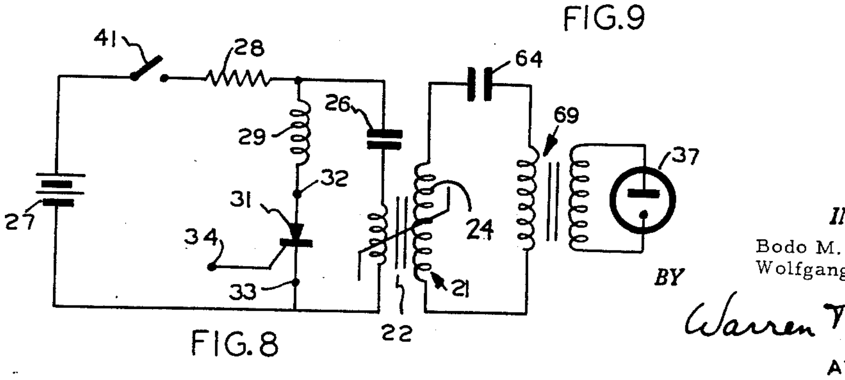
Figure 10:
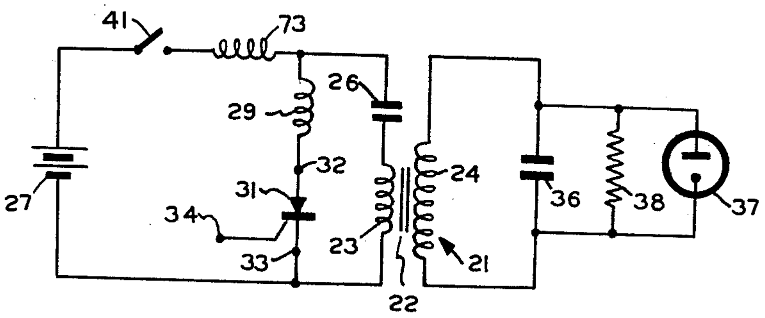
Figure 11:
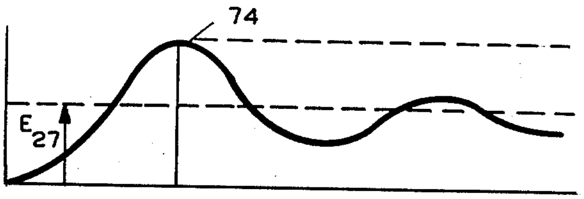

FIGS. 8, 9, and 10 are, respectively, other circuit modifications which may be applied to FIG. 1;

FIG. 11 is a graph illustrating the operation of the circuit of FIG. 10; and

Figure 12:
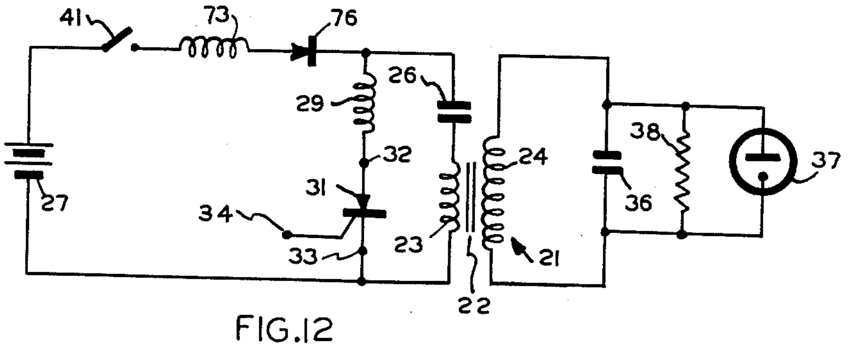

FIG. 12 illustrates still another modification which may be applied to the circuit of FIG. 1.

Referring to the drawings, and at the outset to FIG. 1, 21 represents a transformer having: a saturable core 22, a primary winding 23, and a secondary winding 24. The primary winding 23 is pulsed from a capacitor 26 and a source of electric energy such as battery 27, which are series connected with the primary winding. A charging impedance in the form of a resistor 28 is also preferably inserted in the primary circuit. In parallel with the series connected capacitor 26 and winding 23, are a series connected inductor 29 and rectifying semi-conducting device 31. The semi-conductor 31 may be a silicon controlled gated rectifier having principal terminals 32 and 33 connected in series with the inductor 29, and a third terminal 34 which constitutes a gating terminal. Transformer 21 may be an auto transformer, if desired.

Connected to the secondary winding 24 is a second capacitor 36 which receives energy from the winding 24 and discharges into the load, shown herein as a flash lamp or discharge device 37, connected across the capacitor 36. A relatively high resistance 38 parallels the flash device or lamp 37 to absorb any shock on the system, should the device 37 be disconnected or fail to fire. The resistance 38 is a safety factor and may under certain circumstances be omitted if desired.

The operation of the circuit of FIG. 1 is substantially as follows. As long as the voltage across the terminals 32—33 of the semi-conductor 31 is below the forward breakover voltage, no current flows through that branch of the circuit. Thus, when the switch 41 is closed the capacitor 26 charges through the resistance 28 and primary winding 23. The fully charged voltage of the capacitor 26 is normally somewhat less than the forward breakover voltage of the semi-conductor 31. When a small triggering voltage, in the order of three to five volts, is applied between the terminals 33 and 34 of the semi-conductor, 31, the device 31 is brought into conduction and its resistance abruptly becomes negligible. It is returned to blocking condition only when the anode terminal 32 becomes negative with respect to the cathode 33, or when a brief inverse current flows in the rectifier 31 to stop the electron flow. A switch 41 is provided to complete the circuit.

Figure 2:
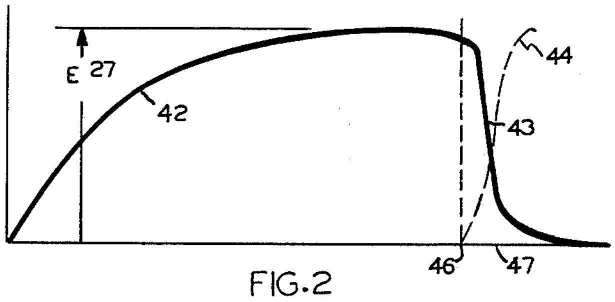
FIGS. 2, 3 and 4 are graphs illustrating certain operational features of the circuit of FIG. 1.

When the switch 41 is closed, the capacitor 26 charges up to the battery voltage E27 substantially on the curve 42 shown in FIG. 2. The charging current quickly drives the transformer core 22 to saturation and practically no voltage is induced in the secondary winding 21 at this time. Thus, the capacitor 36 remains substantially uncharged. When an external trigger signal or voltage is applied to the terminal 34, the capacitor 26 discharges through the elements 29, 31, and 23, and the energy therein is transferred through the transformer 21 to the capacitor 36. The series inductor 29 and the capacitors 26 and 36 represent in essence an oscillatory circuit which causes a sinusoidal discharge of capacitor 26 and corresponding charge of capacitor 36. The discharge of capacitor 26 is shown by the portion 43 of the curve in FIG. 2, while the charging of capacitor 36 is shown by the dotted curve 44 in FIG. 2. The energy transfer period is from the time 46, when the triggering voltage as applied to the terminal 34, to the time 47, when the capacitor 36 is substantially fully charged. In FIG. 2 the transformer 21 has been assumed as having unity turns ratio. In practice the transformer 21 is usually a step up transformer, in which case the capacitor 36 would actually charge to a voltage many times that of the battery voltage 27.

Figure 3:
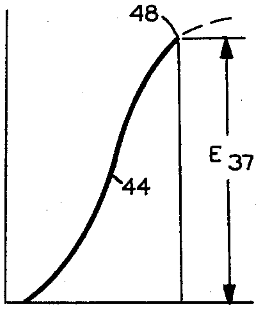

In practice it is preferred to design the circuit so that the discharge tube or device 37 breaks down and fires appreciably prior to attainment of the peak voltage of capacitor 36, as shown in FIG. 3. In FIG. 3, E37 represents the break down voltage of the device 37, at which point the capacitor 36, charging along the curve 44, discharges all of its energy through the tube 37.

After discharge of the capacitor 26, the voltage across the terminals 32—33 of the control rectifier 31 drops to the point where conduction ceases, and thereafter the voltage may again be built up by charging the capacitor 26 as desired.

To give added assurance that the gated rectifier 31 will be returned unquestionably to the non-conduction state the capacitor 26 may be made slightly smaller than capacitor 36 (when referred to unity turns ratio of transformer 21). Expressed mathematically this relation is:

$$C26 < N^2 C36$$

Figure 4:
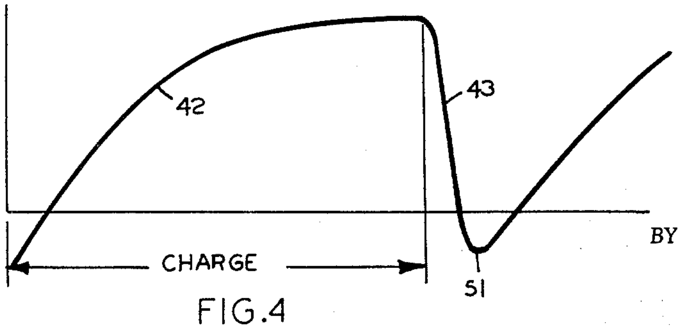

With such parameters the anode 32 of the rectifier 31 goes slightly negative at the end of the discharge cycle, as shown at 51 in FIG. 4, thereby causing a slight inverse or reverse current through rectifier 31. To assure occurrence of this phenomenon, the ratio by which C26 should be smaller than C36 depends on the Q of the circuit, the ratio being larger when Q is smaller.

Figure 5:
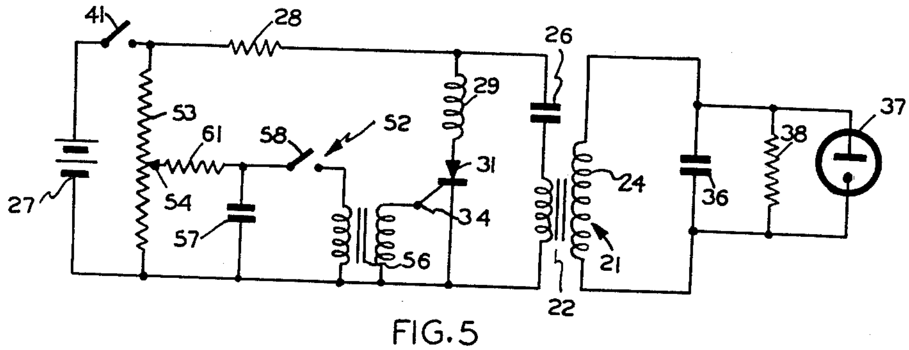
FIG. 5 is a circuit illustrating how a portion of the circuit of FIG. 1 may be modified.

If desired, the circuit of FIG. 1 may be conveniently modified as shown in FIG. 5, so that the same voltage source 27 also provides a source of triggering voltage. This is effected by providing a triggering circuit 52 comprising a potentiometer 53 connected across the battery 27. The slider 54 connects to a transformer 56, the output of which is connected to the gating terminal 34 of the gated rectifier 31. In operation, closing of the main switch 41 initiates charging of both the main capacitor 26 and the auxiliary capacitor 57. At any time after capacitor 57 is charged, triggering switch 58 may be closed, thereby applying a triggering pulse, which is transmitted through the transformer 56 to the gating terminal 54. If desired, the transformer may be omitted and the pulse applied directly from the capacitor 57 to the terminal 34. One advantage of employing the transformer 56 is to isolate the triggering source from the terminal 34, except for transient effects such as pulses. Thus, the switch 58 may remain closed after the initial triggering operation without affecting the circuit function.

In most instances, it is preferred to make the time constant of the triggering circuit (R61) (C57) equal to or larger than the time constant of the main circuit (R28) (C26). This assures that the circuit cannot be triggered before capacitor 26 had reached substantially full charge.

Figure 7:
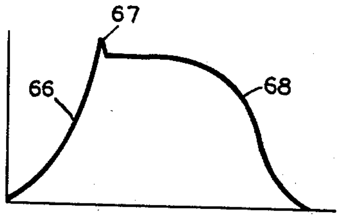
FIG. 7 is a graph or diagram illustrating a feature of operation of the circuit of FIG. 6.
Figure 6:
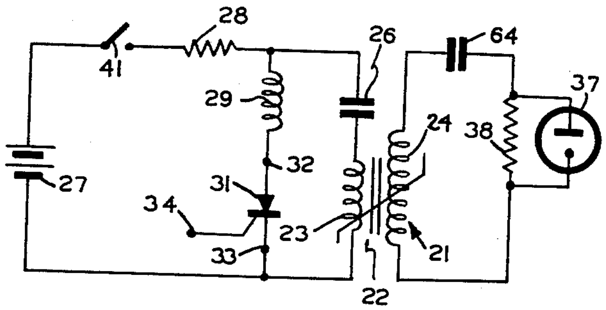
FIG. 6 is a diagram illustration how another portion of the circuit of FIG. 1 may be modified.

In the modification shown in FIG. 6, a capacitor 64 is placed in series with the load 37 and its parallel shunting resistor 38. In this case, the resistor 38 (or an equivalent) is essential in order to complete a current path through which the capacitor 64 may receive the pulse of energy from the primary capacitor 26. In FIG. 6, when capacitor 26 discharges its energy into capacitor 64, the transformer 21 saturates when capacitor 64 reaches its peak voltage. The energy stored in 64 then discharges through the winding 24 of transformer 21, which represents only a nominal linear inductance during this time, since the core 22 is saturated. The voltage across resistor 38 rises rapidly, as shown at 66 in FIG. 7 until the firing voltage of the load 37 is reached at 67, at which time the load 37 fires, and the energy is absorbed therein, with the voltage dropping as shown at 68 in FIG. 7.

If desired, the load circuit may include another pulse transformer 69 to further step up the voltage, as shown in FIG. 8. FIG. 8 represents in effect, a modification of FIG. 6, in which the secondary winding 24 need not produce as high a voltage, as long as capacitor 64 is charged with sufficient energy. Furthermore, the resistor 38 of FIG. 6 may be omitted in FIG. 8, because the charging path for the capacitor 64 is completed by the primary winding of the transformer 69.

In FIG. 9 is shown how the circuit may be further cascaded with additional pulse transformers 71 and 72 in the secondary of the main transformer 21. The circuit may be terminated either as shown in FIGS. 1, 6, or 8; the terminal arrangement of FIG. 6 is illustrated in FIG. 9. In the operation of the circuit of FIG. 9 transformers 21, 71, and 72 saturate in succession, successively transferring energy from one stage to the next.

If desired a resonating inductor 73 may be included in the charging circuit as shown in FIG. 10. In FIG. 10 when the switch 41 is closed, the voltage across the capacitor 26 oscillates as shown in FIG. 11. By properly timing the trigger pulse applied to the gating terminal 34 so as to cause the control rectifier 31 to fire at time 74, energy may be transferred from capacitor 26 when its voltage is at substantially twice the battery voltage E27. The advantage gained by triggering that the energy stored in the capacitor 26 at that moment is four times as large as when the voltage is equal only to the battery voltage. Furthermore, no energy is wasted in a series resistor, such as the resistor 28, during the charging of capacitor 26. This circuit is quite useful when periodic regular firing of the flash device 37 is desired.

Criticality of firing at 74 may be obviated by inserting a blocking rectifier 76 in series with the inductor 73, as shown in FIG. 12. This serves to hold the charge at its maximum value, which is substantially twice E27 (FIG. 11). By use of the circuit shown in FIG. 12, the gated rectifier 31 may be fired at any time after the capacitor has reached its maximum charge shown at 74, at FIG. 11. This circuit is thus useful for random as well as periodic triggering of the flash device 37.

While the instant invention has been shown and described herein in what is conceived to be the most practical and preferred embodiments, it is recognized that departures may be made therefrom within the scope of the invention which is therefore not to be limited to the details disclosed herein but is to be afforded the full scope of the claims.

What is claimed is:

1. Pulse circuit comprising transformer means having primary and secondary windings and a saturable core, a first capacitor and a source of electric energy connected in series with said primary winding, a series connected semi-conductor and inductor connected in parallel with said series connected first capacitor and primary winding, said semi-conductor having three terminals, two of said terminals being connected in series with said inductor and the third of said terminals being a gating terminal, a second capacitor connected to said secondary winding to receive energy transferred from said first capacitor through said transformer, and a load connected to said second capacitor to receive a pulse of energy therefrom.

2. Circuit in accordance with claim 1 including triggering circuit means connected to said gating terminal of said semi-conductor.

3. Circuit in accordance with claim 1 wherein said load is connected in series with said second capacitor.

4. Circuit in accordance with claim 1 wherein:

$$C1 < N^2 C2$$

and C1 represents the capacity of said first capacitor, C2 represents the capacity of said second capacitor, and N represents the turns ratio of said transformer.

5. Circuit in accordance with claim 1 including in addition a series connected inductor and rectifier connected in series with said source of energy to effect resonant charging of said first capacitor.

6. A pulse circuit comprising:

transformer means having primary and secondary windings and a saturable core;

a first capacitor adapted to be charged by a suitable electrical source;

a discharge control means in a discharge circuit, said circuit including said transformer primary winding and said first capacitor, said discharge control means characterized by inability to conduct a current therethrough until a predetermined electrical condition is impressed thereon, whereafter it becomes highly conductive, and being further characterized by being returnable to a non-conductive condition by a reversal of current flow direction therein;

a second capacitor operatively connected to be charged from said transformer secondary winding; and a pulse operated load means connected to derive power from said second capacitor.

7. In the pulse circuit of claim 6, said discharge control means being a rectifying solid state device having a gating terminal, said device being caused to become conductive by impressing a voltage upon said gating terminal.

8. In the pulse circuit of claim 7, voltage for the gating terminal being supplied from the same electrical source as the supply to said first capacitor, said voltage application being applied through a time delay capacitor to thereby allow the said first capacitor to build up a full charge before being discharged.

9. A pulse circuit comprising:

transformer means having primary and secondary windings and a saturable core;

a first capacitor adapted to be charged by a suitable electrical source;

a second capacitor connected to be charged from said secondary winding of the transformer;

a semi-conductor discharge control means in a discharge circuit, said circuit including said transformer primary winding and said first capacitor, said discharge control means characterized by inability to conduct a current therethrough until a predetermined electrical condition is impressed thereon whereafter it becomes highly conductive, and being further characterized by being returnable to a non-conductive condition by a reversal of current flow direction therein; and a pulse operated load means connected in series with said second capacitor, whereby the source will build up a predetermined energy level in said first capacitor and the first capacitor will thereafter discharge and impress a voltage through said transformer upon said second capacitor until that capacitor builds up a high energy level and discharges through said load means.

10. A pulse circuit comprising:

a step-up transformer having primary and secondary windings and a saturable core;

a first capacitor adapted to be charged by a suitable electrical source;

a second capacitor connected to be charged from said secondary windings of the transformer, a gated rectifier in a discharge circuit, said discharge circuit including said transformer primary winding and said first capacitor, said gated rectifier characterized by inability to conduct a current therethrough until a predetermined electrical condition is impressed upon the gate terminal thereof whereafter it becomes highly conductive; and a pulse operated load means operatively connected in series with said second capacitor.

11. Pulse circuit comprising transformer means having primary and secondary windings and a saturable core, a first capacitor and a source of electric energy connected in series with said primary winding, a series connected semiconductor and inductor connected in parallel with said series connected first capacitor and primary winding, said semi-conductor having three terminals, two of said terminals being connected in series with said inductor and the third of said terminals being a gating terminal, a second capacitor connected to said secondary winding to receive energy transferred from said first capacitor through said transformer, a flash discharge load device connected to said second capacitor to receive a pulse of energy therefrom, and a relatively high resistance placed in parallel with said flash discharge device to absorb the energy and avoid shock when said flash discharge device fails to fire or is disconnected from the circuit.

12. Pulse circuit comprising transformer means having primary and secondary windings and a saturable core, a first capacitor and a source of electric energy connected in series with said primary winding, a series connected semiconductor and inductor connected in parallel with said series connected first capacitor and primary winding, said semi-conductor having three terminals, two of said terminals being connected in series with said inductor and the third of said terminals being a gating terminal, a second capacitor connected to said secondary winding to receive energy transferred from said first capacitor through said transformer, a flash discharge load device including a second transformer having a saturable core, the output of said core being connected to said flash discharge load device, and the load device including the said second transformer connected to said second capacitor to receive a pulse of energy therefrom.

References Cited in the file of this patent

UNITED STATES PATENTS

| | | |
|---|---|---|
| 2,722,629 | Germeshausen | Nov. 1, 1955 |
| 3,030,548 | Johnston | Apr. 17, 1962 |

FOREIGN PATENTS

| | | |
|---|---|---|
| 1,155,613 | France | May 6, 1958 |